United States Patent
Wong et al.

[11] Patent Number: 5,250,464
[45] Date of Patent: Oct. 5, 1993

[54] METHOD OF MAKING A LOW CAPACITANCE, LOW RESISTANCE SIDEWALL ANTIFUSE STRUCTURE

[75] Inventors: Man Wong; David K. Liu, both of Dallas, Tex.

[73] Assignee: Texas Instruments Incorporated, Dallas, Tex.

[21] Appl. No.: 850,192

[22] Filed: Mar. 11, 1992

[51] Int. Cl.$^5$ ............................................... H01L 21/14
[52] U.S. Cl. ................................... 437/170; 437/195; 437/922; 148/DIG. 55
[58] Field of Search ............... 437/170, 195, 40, 922; 148/DIG. 55

[56] References Cited

U.S. PATENT DOCUMENTS

| | | | |
|---|---|---|---|
| 4,966,867 | 10/1990 | Crotti et al. | 437/195 |
| 5,089,432 | 2/1992 | Yoo | 437/40 |
| 5,100,827 | 3/1992 | Lytle | 437/922 |
| 5,106,773 | 4/1992 | Chen et al. | 437/922 |
| 5,110,754 | 5/1992 | Lowrey et al. | 437/922 |
| 5,110,766 | 5/1992 | Maeda et al. | 437/195 |
| 5,120,679 | 6/1992 | Boardman et al. | 437/922 |

*Primary Examiner*—Brian E. Hearn
*Assistant Examiner*—Linda J. Fleck
*Attorney, Agent, or Firm*—Jacqueline J. Garner; Richard Donaldson; William E. Hiller

[57] ABSTRACT

A method and resulting structure to provide an antifuse wherein the resistance of the programmed fuse and the line resistance and capacitance are materially reduced relative to the prior art and the procedures involved and the resulting structure of the fuse permit the use of materials not available in prior art antifuses. This is accomplished by providing the fuse on vertical sidewalls of the fuse electrode or beneath a sidewall oxide on the fuse electrode. Since the thickness of the electrode can be controlled to an extent not currently achievable by lithographic means, a much smaller area antifuse is provided using sidewall antifuse as opposed to a planar antifuse. The method of forming the antifuse structure comprises the steps of forming a pedestal having a sidewall comprising a first layer of electrically conductive material and a first electrically insulating layer thereon, forming a conformal layer of electrically conductive material on the pedestal and exposed substrate extending along the sidewall, forming a sidewall insulating layer along the sidewall portion of the layer of electrically conductive material, removing all of the exposed portion of the layer of electrically conductive material while retaining the portion of the layer of electrically conductive material between the pedestal and the sidewall insulating layer, forming a second layer of electrically insulating material over the structure, and forming a second layer of electrically conductive material over the second layer of electrically insulating material.

8 Claims, 2 Drawing Sheets

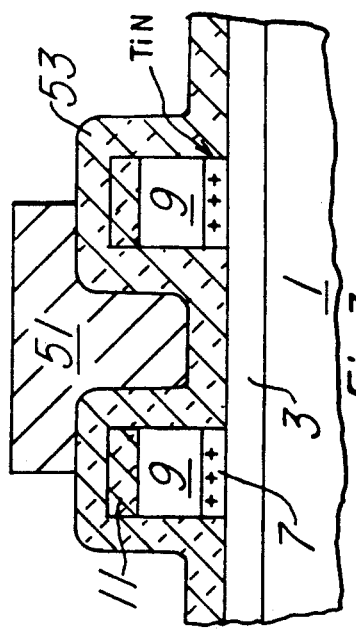
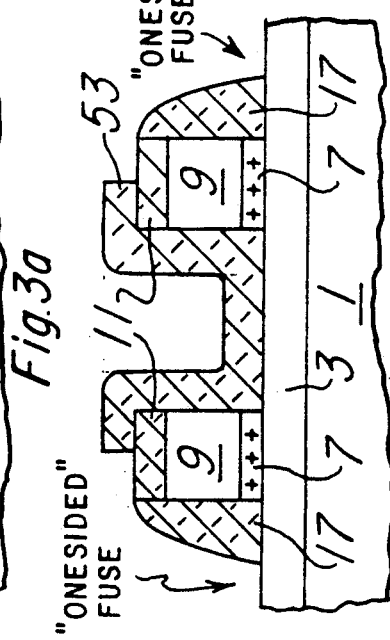
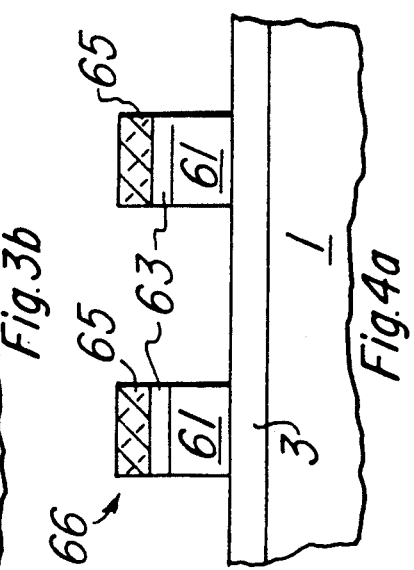
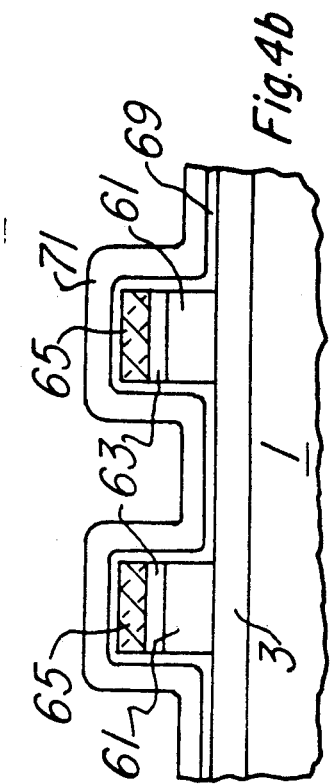
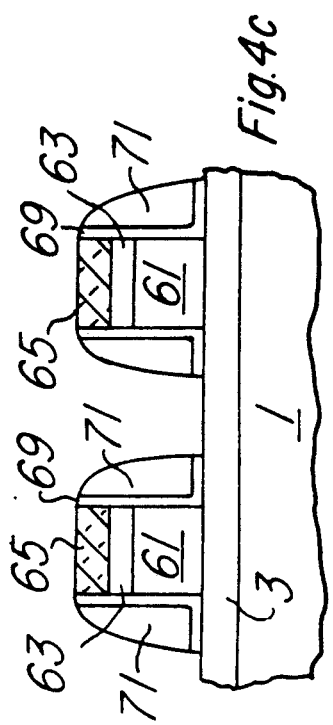
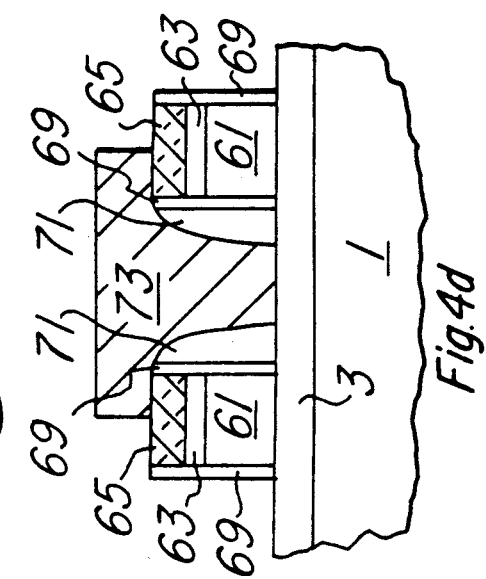

5,250,464

METHOD OF MAKING A LOW CAPACITANCE, LOW RESISTANCE SIDEWALL ANTIFUSE STRUCTURE

CROSS REFERENCE TO RELATED APPLICATIONS

Reference is hereby made to related prior applications of K. L. Chen et al., Ser. No. 07/595,063, filed Oct. 9, 1990 now U.S. Pat. No. 5,106,773 and D. K. Liu et al., Ser. No. 07/657,703, filed Feb. 19, 1991, the contents of which are incorporated herein by reference.

BACKGROUND OF THE INVENTION

1. Field of the Invention

This invention relates to integrated circuit technology and, more specifically, to antifuse structures and methods of fabrication thereof which provide an electrical programmable physical connection between two previously unconnected circuit locations.

2. Brief Description of the Prior Art

Programmable integrated circuits have been developed which allow the user to program the integrated circuit to a specific need. A type of programmable device is a field programmable gate array (FPGA). These devices provide large arrays of fusible type structures on a substrate which allow the user to program the functional operation of the devices by altering the conductive state of these fusible devices. One such fusible device is called an antifuse. An antifuse operates in the opposite manner to that of a traditional fuse in that it is programmed by providing a voltage above a threshold determined by the characteristics of the device which causes a large current to pass between two conductive layers separated by a dielectric layer. After this threshold voltage has been reached, the dielectric breaks down and a conductive connection is established between the two conductive layers via a filament formed through an aperture in the dielectric layer.

Also, due to limitations presently inherent in the photolithographic procedures available, the dimensions of the fuse are not reducible to the extent desirable, hence leading to larger than desired capacitance in the fuse region. These capacitances result in large RC delays in high frequency applications, as is well known.

SUMMARY OF THE INVENTION

In accordance with the present invention, there is provided a method and resulting structure whereby an antifuse is obtained and wherein the resistance and capacitance of an anti-fuse network are simultaneously reduced relative to the prior art. In addition, the procedures involved and the resulting structure of the fuse permit the use of materials not available in prior art antifuses, resulting in optimal choice of material usage.

Briefly, this is accomplished by providing the fuse on the base portions of the vertical sidewalls of a pedestal or stack. Since the thickness of the electrode can be controlled to an extent not currently achievable by lithographic means, a much smaller area antifuse is provided using sidewall antifuse as opposed to a planar antifuse.

The method of forming an antifuse structure comprises the steps of providing a substrate having an oxide layer on a surface thereof, forming a pedestal having a sidewall on the oxide layer comprising a first layer of electrically conductive material on the oxide layer and a first electrically insulating layer on the first electrically conductive layer remote from the oxide layer, forming a conformal layer of electrically conductive material on the pedestal and extending along the sidewall, forming a sidewall insulating layer along the sidewall portion of the layer of electrically conductive material, removing all of the exposed portion of the layer of electrically conductive material while retaining the portion of the layer of electrically conductive material between the pedestal and the sidewall insulating layer, forming a second layer of electrically insulating material over the structure, and forming a second layer of electrically conductive material over the second layer of electrically insulating material.

BRIEF DESCRIPTION OF THE DRAWINGS

FIGS. 3a and 3b show alternate steps in the process flow used in formation of the embodiment of FIGS. 1 or 2 to provide a third embodiment in accordance with the present invention; and FIGS. 4a through 4d are a cross-section of a third embodiment of the invention.

DESCRIPTION OF THE PREFERRED EMBODIMENT

Figure 1A:
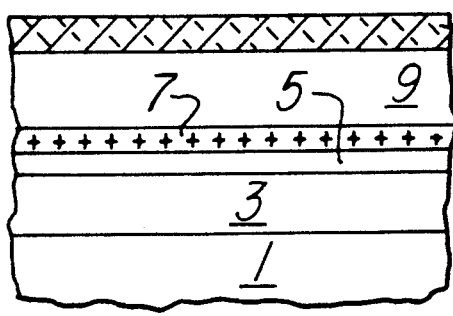
FIGS. 1a through 1f demonstrate the process flow for fabrication of an antifuse device in accordance with a first embodiment of the present invention.
Figure 1E:
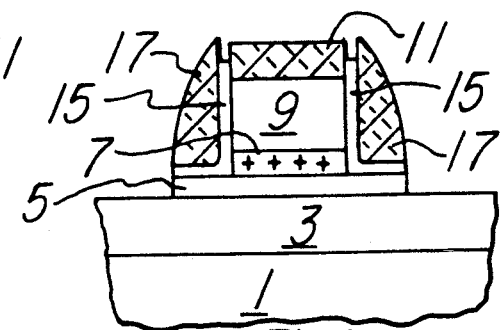
Figure 1B:
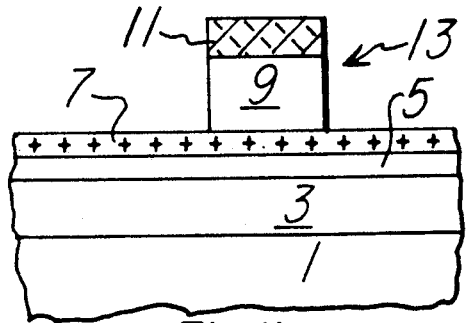
Figure 1F:
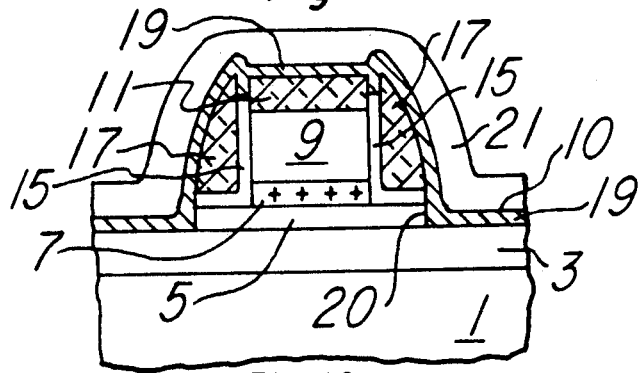
Figure 1C:
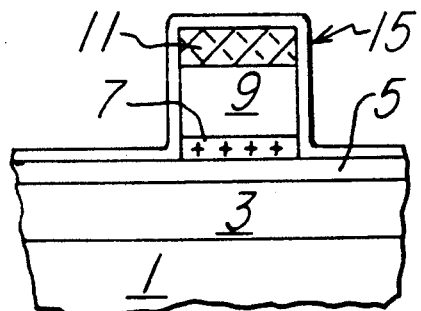

Referring first to FIG. 1a, there is shown a silicon substrate 1 having an insulating layer 3 thereon which can be, for example, a standard thermal oxide. A 500 to 1000 angstrom layer of electrically conductive material, preferably polysilicon 5 is then deposited by standard chemical vapor deposition (CVD) over the oxide layer 3 followed by a 50 to 100 angstrom layer of silicon oxide 7, also formed by CVD techniques or thermally grown. A 2500 to 4000 angstrom layer of polysilicon 9 which is deposited by standard CVD techniques over the silicon oxide layer 7 and then a 2000 angstrom thermal oxide 11 is formed thereover. All of the polysilicon layers can be doped by ion implantation or in a furnace. The structure of FIG. 1a is then patterned with a resist in standard manner and etched down to the oxide layer 7, leaving a stack 13 including the remaining portion of the polysilicon layer 9 and the silicon oxide layer 11 in the unetched regions as shown in FIG. 1b. The remaining portion of the silicon oxide layer 7 is then removed by standard etching techniques and a thin 200 to 1000 angstrom layer of polysilicon 15 is conformally deposited over the entire structure by CVD as shown in FIG. 1c.

Figure 1D:
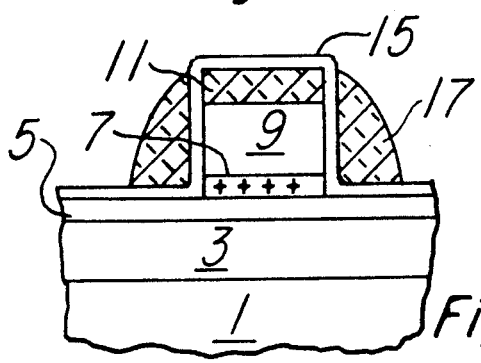

A layer of silicon dioxide 1500 to 5000 angstroms thick is then conformally deposited by CVD and the structure is then anisotropically etched in standard manner down to the polysilicon layer 15, leaving a sidewall oxide 17 on the sides of the stack 13 plus the portion of thin oxide 7 covered by the stack with the polysilicon layer 15 disposed between the sidewall oxide 17 and the stack 13 as shown in FIG. 1d. The exposed polysilicon 15 and polysilicon 5 therebelow are then etched away in standard manner, leaving polysilicon 15 disposed between the sidewall oxide 17 and the stack 13 and in contact with the polysilicon region 9 plus the portions of thin oxide 7 covered by the stack and between the sidewall oxide 17 and the polysilicon layers 5 and 15 thereunder as shown in FIG. 1e. A layer of dielectric material 19 which is 80 to 100 angstroms thick, preferably of either silicon oxide or oxidized silicon nitride, is deposited by CVD or thermally grown over the surface of the structure of FIG. 1e and a conductor material 21, such as and preferably polysilicon, is then formed over the dielectric layer 19 to provide the antifuse structure as shown in FIG. 1f. The antifuse at the region 20 is provided by contact of the polysilicon 15 with the electrode 21 through the oxide 19.

It should be understood that plural spaced apart structures of the type shown in FIG. 1f can and generally will be formed simultaneously on the same substrate, resulting in an array of antifuses.

It can be seen that the polysilicon region 9 is electrically coupled to the polysilicon region 15 to form a single electrically conductive path and that the polysilicon region 15 is spaced from the conductor 21 by the small distance taken up by insulator 19 which is between the polysilicon regions 5 and 15 and the top electrode 21 at the bottom of the stack 13. This preferred embodiment allows reduction of the resistance of the antifuse electrode. Accordingly, when a predetermined high voltage is applied across the region 20 between the conductor 21 and the polysilicon region 9, the portion of the oxide layer 19 is short circuited by a conducting filament between the polysilicon 5+15 and conductor 21, thus forming an electrical connection therebetween.

It should be understood that there are many possible variations of the above described method and structure. For example, the oxide layer 7 can be replaced by an electrically conductive layer with good etch selectivity to polysilicon, thereby eliminating the steps wherein the exposed thin oxide 7 is removed, and the polysilicon layer 15 can be eliminated. Also, the polysilicon layer 9 can be strapped with low resistance materials such as refractory metals or silicides to reduce line resistance. In addition, an optional silicidation step can be performed after etching of the polysilicon 15 as shown in FIG. 1e to allow implementation of a silicide antifuse.

Figure 2:
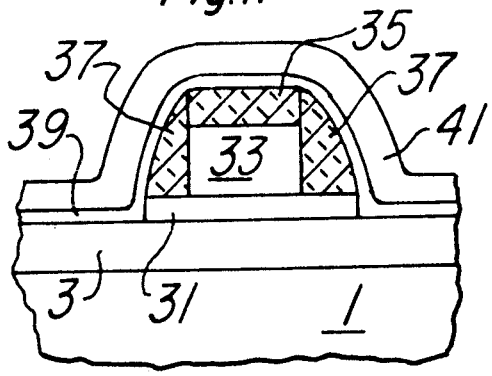
FIG. 2 is a cross-section showing a second embodiment of an antifuse device in accordance with the present invention.

Furthermore, a metal-to-metal antifuse can be implemented which has the advantage that the etched vertical surface can be smoother than the deposited top surface to provide higher reliability. In this case, the polysilicon layer 9 is replaced by tungsten which can be deposited by CVD or sputtered over a layer of aluminum which replaces polysilicon layer 5 and oxide layer 7. Such a structure is shown in FIG. 2 wherein there is provided a substrate 1 with an oxide layer 3 thereon as in FIG. 1. An aluminum layer 31 is disposed over the oxide layer 3 with a layer of tungsten 33 thereover and an oxide layer 35 over the tungsten layer. A sidewall oxide 37 is on the aluminum layer 31 and, with the oxide layer 35, encloses the tungsten layer 33. The sidewall oxide 37 defines the edge of the aluminum layer 31. A low temperature fuse dielectric layer, preferably CVD silicon oxide or amorphous silicon 39, is deposited over the entire structure and an electrically conductive material, preferably a metal 41 is deposited over the dielectric layer 39. The short path from the combination of tungsten layer 33 and attached aluminum layer 31 to the conductor 41 extends through the fuse dielectric 39. Operation is the same as discussed above with respect to FIG. 1.

The capacitance of the antifuse can be further reduced by forming the fuse structure on only one side of the stack. This requires an additional masking step in accordance with the process flow as discussed in conjunction with FIG. 1. More specifically, after formation of the oxide layer 53 from which the sidewall oxide or spacer 17 is formed, a photoresist 51 is disposed over a portion of the oxide 53 prior to the etching step of FIG. 1d wherein the sidewall oxide 17 is to be formed as shown in FIG. 3a. Accordingly, when the etching step of FIG. 1d now takes place, the oxide layer 53 is not removed on one side of the stack and only the sidewall oxide 17 remains on the other side of the stack. This embodiment can be applied in conjunction with the embodiments of FIGS. 1 or 2.

Referring now to FIG. 4, there is shown a process flow for providing a further embodiment in accordance with the present invention. As can be seen with reference to FIG. 4a, there is provided a silicon substrate 1 having an oxide layer 3 thereover as in the embodiment of FIG. 1. Successive layers of polysilicon 61, a dielectric layer 63, preferably silicon oxide, and then a further dielectric layer 65, preferably silicon nitride are deposited over the oxide layer 3, patterned and etched, all in standard manner, to provide the stack structure 66 as shown in FIG. 1a. A dielectric layer 67, preferably silicon nitride, which is an etch stop, is conformally deposited over the stack 66 followed by a conformally deposited layer 69 of a spacer dielectric 71, preferably silicon oxide to provide the structure as shown in FIG. 4b. This structure is then anisotropically etched by reactive ion etch in standard manner down to the oxide layer 3, leaving a sidewall nitride 69 with a sidewall oxide 71 thereover as shown in FIG. 4c. The structure of FIG. 4c is patterned with a photoresist 73 and etched to remove the sidewall oxide spacer 71 on one of the two walls of the stack 66 as shown in FIG. 4d. The exposed layer 69 and photoresist 73 are then removed by standard techniques and the procedure continues with the addition of oxide layer 19 and electrode 21 as described in conjunction with FIG. 1f.

As a further embodiment, the etch stop dielectric layer 7 of FIG. 1a can be replaced by TiN with the remaining processing steps being the same as set forth hereinabove with reference to FIG. 1. Since TiN is also electrically conductive, it will connect the region 9 to the region 5, thereby avoiding the step of providing the polysilicon layer 15 which is required to connect together the regions 9 and 5 and thereby save a processing step.

Advantages in the above described structures over the prior art are that a wide range of electrode materials can be used, thereby allowing independent tailoring of line resistances and fuse resistances. Furthermore, the fuse area and, hence, the capacitance is controlled by the thickness of the bottom polysilicon electrode 15 in the basic structure, the polysilicon layer 5 or the aluminum layer in embodiments wherein aluminum replaces the polysilicon. Thus, much smaller dimensions can be achieved by the above described method than are achievable with prior art technology due to the limitations in lithographic techniques.

Though the invention has been described with respect to specific preferred embodiments thereof, many variations and modifications will immediately become apparent to those skilled in the art. It is therefore the intention that the appended claims be interpreted as broadly as possible in view of the prior art to include all such variations and modifications.

We claim:

1. A method of forming an antifuse structure comprising the steps of:

(a) providing a substrate having an oxide layer on a surface thereof,
(b) forming a pedestal having a sidewall on said oxide layer comprising a first layer of electrically conductive material on said oxide layer and a first electrically insulating layer on said first electrically conductive layer remote from said oxide layer,
(c) forming a conformal layer of electrically conductive material on said pedestal and exposed substrate extending along said sidewall,
(d) forming a sidewall insulating layer along the sidewall portion of said layer of electrically conductive material,
(e) removing all of the exposed portion of said layer of electrically conductive material while retaining the portion of said layer of electrically conductive material between said pedestal and said sidewall insulating layer,
(f) forming a second layer of electrically insulating material over the structure of (e), and
(g) forming a second layer of electrically conductive material over said second layer of electrically insulating material.

2. The method of claim 1 wherein said first electrically conductive layer is polysilicon.

3. The method of claim 1 wherein said conformal layer of electrically conductive material is polysilicon.

4. The method of claim 2 wherein said conformal layer of electrically conductive material is polysilicon.

5. The method of claim 3 wherein said second layer of electrically conductive material is a metal.

6. The method of claim 1 further including the step of applying a predetermined electrical potential between said first layer of electrically conductive material and said second layer of electrically conductive material sufficient to cause breakdown of the portion of said second layer of electrically insulating material between said first and second layers of electrically conductive material and coupling of said conformal layer and said third layer of electrically conductive material.

7. A method of forming an antifuse structure which comprises the steps of:
(a) providing a substrate,
(b) forming a pedestal on said substrate having a sidewall and comprising a first electrically conductive layer and a first electrically insulating layer thereover and remote from said substrate, both of said first layers extending to said sidewall,
(c) forming a second electrically conductive layer contacting said first electrically conductive layer and disposed along said sidewall,
(d) forming a second electrically insulating layer extending along said second electrically conductive layer and remote from said pedestal, leaving exposed portions of said second electrically conductive layer,
(e) forming a third electrically insulating layer extending over said exposed portions of said second electrically conductive layer, and
(f) forming a third electrically conductive layer disposed over said second electrically insulating layer and closely spaced from said second electrically conductive layer.

8. The method of claim 7 further including the step of applying a predetermined electrical potential between said first electrically conductive layer and said third electrically conductive layer sufficient to cause breakdown of the portion of said second electrically insulating layer between said second and third electrically conductive layers and coupling of said second and third electrically conductive layers.

* * * * *